United States Patent
Shirai et al.

Patent Number: 5,278,029
Date of Patent: Jan. 11, 1994

[54] METHOD FOR FORMING A RESIST PATTERN

[75] Inventors: Masamitsu Shirai; Masahiro Tsunooka; Kanji Nishijima, all of Osaka, Japan

[73] Assignee: Nippon Paint Co., Ltd., Osaka, Japan

[21] Appl. No.: 888,901

[22] Filed: May 26, 1992

[30] Foreign Application Priority Data

May 24, 1991 [JP] Japan ............... 3-222520

[51] Int. Cl.⁵ ............... G03F 7/36
[52] U.S. Cl. ............... 430/325; 430/323; 430/324; 430/314; 156/643; 156/659.1
[58] Field of Search ............... 430/311, 315, 324, 325, 430/326, 313, 314, 323; 156/643, 659.1

[56] References Cited

U.S. PATENT DOCUMENTS

| | | | |
|---|---|---|---|
| 4,552,833 | 11/1985 | Ito et al. | 430/313 |
| 4,751,170 | 6/1988 | Mimura et al. | 430/313 |
| 4,782,008 | 11/1988 | Babich et al. | 430/313 |

FOREIGN PATENT DOCUMENTS

| | | | |
|---|---|---|---|
| 0412326 | 2/1991 | European Pat. Off. | 430/325 |
| 3024550 | 2/1991 | Japan | 430/324 |

Primary Examiner—Marion E. McCamish
Assistant Examiner—Janis L. Dote
Attorney, Agent, or Firm—Wenderoth, Lind & Ponack

[57] ABSTRACT

A method for forming a resist pattern comprising applying onto a base plate a resinous composition comprising a compound capable of generating an acid when irradiated with actinic rays to obtain a photosensitive layer, exposing the thus formed layer through a pattern mask to actinic rays, applying onto the whole surface of the layer an alkoxysilane gas and subjecting the thus treated layer to dry etching to remove unexposed area of said layer. By the adoption of the present method, a very fine resist pattern which is useful for the preparation of semiconductor element, magnetic bubble memory element and the like, can be easily and economically prepared.

3 Claims, 1 Drawing Sheet

METHOD FOR FORMING A RESIST PATTERN

FIELD OF THE INVENTION

The present invention relates to a method for forming a resist pattern and more specifically, it concerns a method for forming a fine resist pattern having a wire size of sub-micron order, comprising utilizing a thin film forming technique and a photolithography, which is useful in the preparation of an electron circuit element having a fine pattern, such as semiconductor element, magnetic bubble memory element and the like.

BACKGROUND OF THE INVENTION

In the preparation of an electron circuit element having a fine pattern such as semiconductor element, magnetic bubble memory element and the like, a photosensitive resin coating is first applied, by means of a spin coating or the like, on the surface of a base plate to be processed. Then, the coating is exposed, through a pattern mask, to an actinic radiation and developed in a developer, thereby obtaining a resist pattern utilizing a solubility difference between the exposed and the unexposed resin.

In a recent pattern development, the so-called dry etching method, which is quite suitable for the preparation of fine pattern, is often used.

In order to obtain a resist pattern having a highly improved resolving power by a dry etching development technique, it is quite important to use a photosensitive material which shows a big discrepancy in properties between the dry etching resistance at the portion to be retained and brittleness at the portion to be removed at the etching step.

For example, in Japanese Patent Publication (unexamined) No. 127645/90, there is disclosed a method for preparing a resist pattern having an excellent dry etching resistance by utilizing a selective silylation of active hydrogen of Novolak type resin with a comparatively large silicone containing functional group of $-Si(CH_3)_3$.

More concretely, a photosensitive resin having in its molecule an aromatic ring structure with a phenolic hydroxyl group, is applied on a base plate.

Then, the thus formed coating is irradiated with actinic rays in two separate stages, each time using actinic rays each having different wave lengths, thereby forming the coating capable of showing, when subjected to silylation with a hexamethyl disilazane vapor, a big contrast in the dry etching resistance and brittleness in the subsequent dry etching. The desired fine pattern is thus obtained.

In Japanese Patent Publication (unexamined) Nos. 231330/88 and 231331/88, there is disclosed a method wherein a fine pattern is obtained by using a highly sensitive, double-layered positive type resist having an excellent dry etching resistance. For example, in Japanese Patent Publication (unexamined) No. 231330/88, there is disclosed a method wherein an organic resin first layer is applied on a base plate and then a second layer of positive type resist comprising a silicone modified alkali-soluble resin, partial ladder type silicone resin and quinone diazide compound is coated thereon. The thus formed material is exposed through a pattern to actinic rays, the second resist layer is developed with an alkali developer and finally the first organic resin layer is subjected to dry etching to obtain a fine pattern.

However, in the abovementioned selective silylation method, the silylation at the resin portion to be silylated is not so perfect that there is a problem in silylation selectivity in the exposed and the unexposed portions, resulting in deficient dry etching resistance at the unexposed portion, which is unfavorable in obtaining the desired fine pattern.

Moreover, even if the two step exposure technique with actinic rays having different wave lengths has been adopted for the contrasted silylation, the silylation itself is not so effectively done and therefore, additional two step exposure must be used.

Thus, the exposure step is very complicated.

The two layered positive type resist has such problems that the resist must be applied two times and nevertheless the expected dry etching resistance is still not obtained.

It is, therefore, an object of the present invention to provide a method for forming a fine pattern with simple and easy operational steps, in which a resist coating having excellent dry etching resistance is formed on the spot and utilized.

SUMMARY OF THE INVENTION

According to the invention, the abovementioned object can be attained by providing a method for forming a resist pattern comprising applying onto a base plate a resinous composition comprising a compound which can generate an acid when irradiated with actinic rays to obtain a photosensitive layer, exposing the thus formed layer through a pattern mask to actinic rays, applying onto the layer an alkoxysilane gas and subjecting the thus treated layer to dry etching to remove unexposed area of said layer.

Figure 1A:
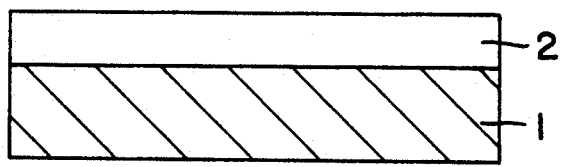
FIG. 1 (a)~(d) show a cross-section of the photosensitive material each in different stages of the present method for the preparation of a resist pattern, in which (a) depicts the photosensitive material used in the present method, (b) depicts the photosensitive material which is under exposure through a pattern mask to actinic rays, (c) depicts the exposed material which is under contact with an alkoxysilane vapor and (d) depicts the alkoxysilane-vapor treated material which is under dry etching with an oxygen plasma.

In the figures, 1 represents a base plate, 2 represents a photosensitive resin layer containing a compound which can generate an acid when irradiated with actinic rays, 3 represents a pattern mask, 4 represents actinic rays, 5 represents exposed area, 6 represents an alkoxysilane gas, 7 represents a silcon dioxide coating and 8 represents an oxygen plasma.

PREFERRED EMBODIMENTS OF THE INVENTION

The inventors, having studied various materials for giving a resist having an excellent dry etching resistance, have found that when a base plate is coated with a resinous composition comprising a compound which can generate an acid when irradiated with actinic rays and the thus formed material is exposed to actinic rays, the exposed area of the coating possess acidic and hydrophilic natures and absorbs an amount of surrounding moisture and can easily react with an alkoxysilane gas through hydrolysis reaction to form silicon dioxide thereon. Therefore, when the exposed material is contacted with an alkoxysilane gas, the exposed area is coated with silicon dioxide which is quite resistive toward dry etching with an oxygen plasma and the unexposed area remains as it is, which is easily etched with the subsequent dry etching with an oxygen plasma. In that way, the desired fine resist pattern can be obtained. The invention has been made on the basis of these findings. In this invention, as a compound which can generate an acid when irradiated with actinic rays, various compounds hereinunder mentioned may be advantageously used. Examples are a photosensitive acrylic resin having an iminosulfonate group disclosed by the present inventors in Japanese Patent Publication (unexamined) No. 163736/89; various tosylate compounds having a o-nitro-benzyl group disclosed in Macromolecules 21, 2001 (1988) by F. M. Hovlihan, A. Shugard, R. Gooden and E. Reichmanis; and various onium salts used as a cationic photoinitiator or chemical amplification type acid generator.

More specifically, the photosensitive acrylic resin disclosed in Japanese Patent Publication (unexamined) No. 163736/89 is an acrylic resin having, in its side chains or end portions of its main chain, at least one iminosulfonate group represented by the formula:

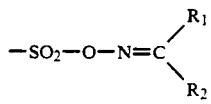

in which $R_1$ and $R_2$ are the same or different groups and each represents hydrogen, alkyl, acyl, phenyl, naphthyl, anthoryl or benzyl group, or $R_1$ and $R_2$ may, taken together with the carbon atom, form an alicyclic ring.

Examples of the tosylate compound having o-nitrobenzyl group are 2-nitrobenzyl tosylate, 2,4-dinitrobenzyl tosylate, 2,6-dinitrobenzyl tosylate and the like.

As the onium salts, mention is made of $BF_4^-$, $PF_6^-$, $SbF_6^-$, $SiF_6^-$ or $AsF_6^-$ salts of diazonium, phosphonium, sulfonium or iodonium and the like.

Examples are as follows:

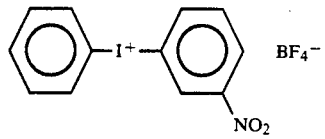

(3-nitrophenyl) phenyliodonium tetrafluoroborate

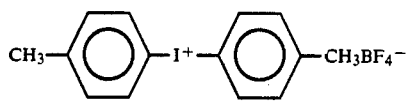

di(4-methylphenyl) iodonium tetrafluoroborate

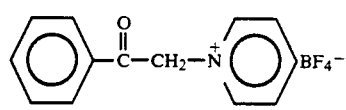

1-(benzoylmethyl) pyridinium tetrafluoroborate

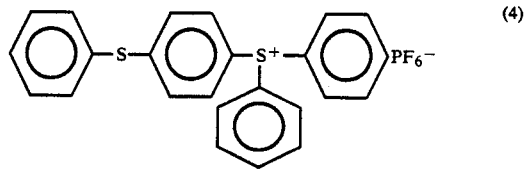

(4-phenylthiophenyl) diphenylsulfonium hexafluorophosphate

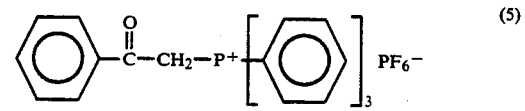

benzoylmethyltriphenylphosphonium hexafluorophosphate

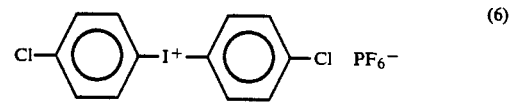

di(4-clorophenyl) iodonium hexafluorophosphate

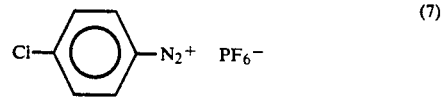

4-chlorobenzenediazonium hexafluorophosphate

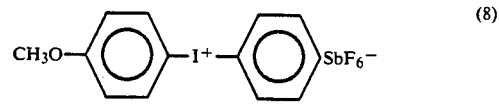

(4-methoxyphenyl) phenyliodonium hexafluoroantimonate

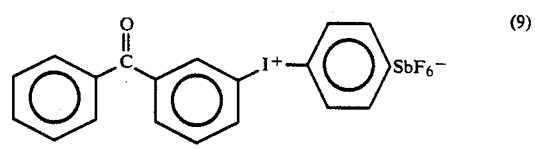

(3-benzoylphenyl) phenyliodonium hexafluoroantimonate

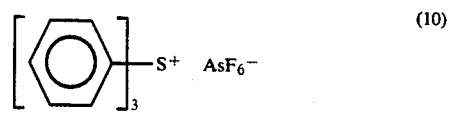

triphenylsulfonium hexafluoroarsenate

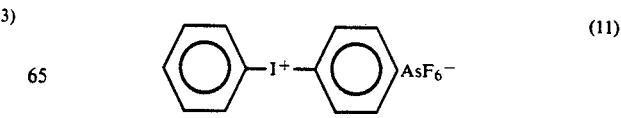

diphenyliodonium hexafluoroarsenate

The abovementioned acrylic resin having an iminosulfonate group may be used as it is as a resinous composition for the present photosensitive coating. However, it is possible to take it as a compound capable of generating an acid when irradiated with actinic rays, just like the abovementioned tosylate compounds and onium salts, and therefore, it can be compounded with a binder resin to form a photosensitive resinous composition.

Examples of such binder resin are acrylic resin, epoxy resin, polybutadiene resin, polyester resin and other coating use resins.

As the compound which can generate an acid when irradiated with actinic rays used in the invention, much preference is given to the compound being responsive to actinic rays in short wave lengths, resulting in a high degree of resolving power, and generating, after photoexposure, a strong acid which is a hydrophilic group having a strong moisture absorbing power.

Furthermore, it should preferably be a compound capable of being formulated into a uniform resinous solution for easy and uniform coating on a base plate and should be free of toxic metal component. In that sense, particularly preferable member is a photosensitive acrylic resin having an iminosulfonate group.

In the present method, the photo-exposed plate is then contacted with an alkoxysilane vapor to convert the exposed area to silicon dioxide layer which is very resistive toward oxygen plasma etching.

Examples of such alkoxysilane are tetra-methoxy silane, tetraethoxy silane, methyl trimethoxy silane, methyl triethoxy silane, dimethoxy dimethyl silane, methoxy trimethyl silane and the like.

The present method shall be now more fully explained hereinunder by referring to the attached drawings.

Figure 1B:
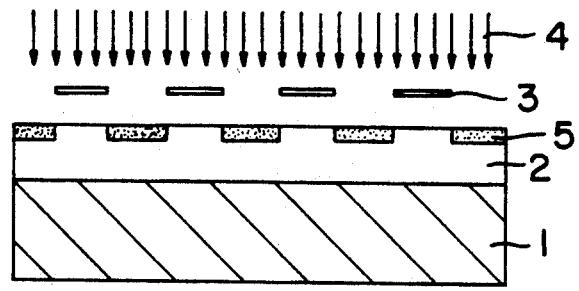
Figure 1C:
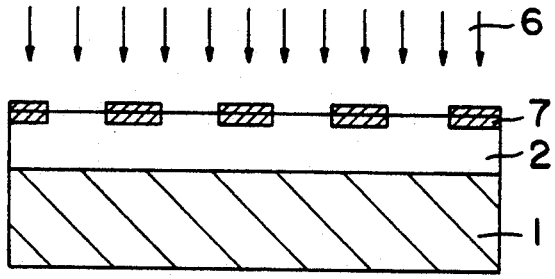
Figure 1D:
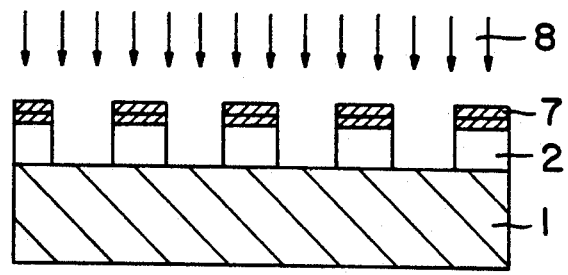

FIG. 1 (a)~(d) show a series of steps involved in the present method.

A base plate (1) is first coated with a resinous (2) containing a compound which can generate an acid when irradiated with actinic rays by means of a spin coater (see FIG. 1 (a)).

Next, the coated plate is exposed through a pattern mask (3) to actinic rays (4) to form an acid containing exposed area (5) (see FIG. 1 (b)).

In the next place, a nitrogen gas is introduced into a vessel contained an alkoxysilane (not shown) and a mixture of nitrogen gas and generated alkoxysilane gas (b) is led onto the whole surface of the exposed material and a silicon dioxide coating (7) is formed at the exposed area (5) (see FIG. 1 (c)).

Finally, thus treated material is subjected to dry etching with an oxygen plasma (8) to remove unexposed and uncovered area to form a fine resist pattern (see FIG. 1 (d)).

Following are Synthetic Examples and Examples of the present invention. Unless otherwise stated, all parts and % are by weight.

SYNTHETIC EXAMPLE 1

Into a 1 liter separable flask, were placed 100 parts of ethyleneglycol monobutyl ether and the content was heated to 120° C. To this, a mixture of 100 parts of ethyleneglycol monobutyl ether, 60 parts of n-butyl acrylate, 50 parts of fluorenone oxime p-styrene sulfonate, 50 parts of methyl methacrylate and 8 parts of azobisisobutyronitrile was dropwise added in 4 hours and after elapsing 30 minutes, a mixture of 30 parts of ethyleneglycol monobutyl ether and 1 part of azobisisobutyronitrile was dropwise added in 30 minutes. Thereafter, the combined was reacted at the same temperature for 1 hour to obtain a solution of acrylic resin (A) having iminosulfonate group (solid content: 40.1%).

SYNTHETIC EXAMPLE 2

Into a 1 liter separable flask, were placed 250 parts of ethyleneglycol monobutyl ether and the content was heated to 120° C. To this, a mixture of 180 parts of methyl methacrylate, 26 parts of methacrylic acid, 130 parts of n-butyl acrylate, 70 parts of tetralone oxime p-styrene sulfonate and 8 parts of azobisisobutyronitrile was dropwise added in 4 hours and after elapsing 30 minutes, a mixture of 50 parts of ethyleneglycol monobutyl ether and 1 part of azobisisobutyronitrile was dropwise added in 30 minutes. Thereafter, the combined was reacted at the same temperature for 1 hour to obtain a solution of acrylic resin (B) having iminosulfonate group (solid content: 56.8%).

SYNTHETIC EXAMPLE 3

Into a 1 liter separable flask, were placed 200 parts of ethyleneglycol monobutyl ether and the content was heated to 120° C. To this, a mixture of 120 parts of ethylmethacrylate, 60 parts of n-butyl methacrylate, 100 parts of methyl methacrylate and 8 parts of azobisisobutyronitrile was dropwise added in 3 hours and after elapsing 30 minutes, a mixture of 30 parts of ethyleneglycol monobutyl ether and 1 part of azobisisobutyronitrile was dropwise added in 30 minutes.

Thereafter, the combined was reacted at the same temperature for 1 hour to obtain an acrylic resin solution having a solid content of 53.9%. To this, 60 parts of 50% 2-nitrobenzyl tosylate-acetone solution were added to prepare a resinous composition (c) which can generate an acid.

SYNTHETIC EXAMPLE 4

Into a 1 liter separable flask, were placed 200 parts of ethyleneglycol monobutyl ether and the content was heated to 120° C. To this, a mixture of 120 parts of ethyl methacrylate, 60 parts of n-butyl methacrylate, 100 parts of methyl methacrylate and 8 parts of azobisisobutyronitrile was dropwise added in 3 hours and after elapsing 30 minutes, a mixture of 30 parts of ethyleneglycol monobutyl ether and 1 part of azobisisobutyronitrile was dropwise added in 30 minutes. Thereafter, the mixture was reacted at the same temperature for 1 hour to obtain an acrylic resin solution having a solid content of 53.9%. As a compound capable of generating an acid, 28 parts of triphenyl sulfonium hexafluoroarsenate were added to obtain a resinous composition (D).

EXAMPLE 1

50 parts of the iminosulfonate group bearing acrylic resin (A) obtained in the Synthetic Example 1 were dissolved in 80 parts of metyl ethyl ketone and the solution was filtered through a millipore filter (0.2 μm) to obtain a photosensitive liquid. Thus obtained liquid was then applied by means of a spinner onto a base plate and then dried in a hot oven (100° C.) for 10 minutes to obtain a photosensitive coating comprised of an acid generatable compound having a film thickness of 1.0 μm. (see FIG. 1 (a)).

The thus formed coating was exposed through a pattern mask to a high pressure mercury lamp having a light intensity of about 5 mw/cm² at 365 nm for 60 seconds ( FIG. 1 (b)).

Thereafter, the mask was removed and the exposed material was thoroughly exposed to methyl trimethoxysilane gas to make at the exposed area a silicon dioxide coating (FIG. 1 (c)) and finally the thus treated material was subjected to dry etching by using an oxygen plasma (oxygen pressure 0.5 torr; plasma output 140 w) for 15 minutes to obtain a fine resist pattern (FIG. 1 (d)).

EXAMPLE 2

50 parts of the iminosulfonate group bearing acrylic resin (B) obtained in the Synthetic Example 2 were dissolved in 140 parts of methyl ethyl ketone and the solution was filtered through a millipore filter (0.2 $\mu$m) to obtain a photosensitive liquid. Thus obtained liquid was then applied by means of a spinner onto a base plate and then dried in a hot oven (100° C.) for 10 minutes to obtain a photosensitive coating comprised of an acid generatable compound having a film thickness of 1.0 $\mu$m.

The thus formed coating was exposed through a pattern mask to a low pressure mercury lamp having a light intensity of about 10 mw/cm$^2$ at 254 nm for 40 seconds. Thereafter, the mask was removed and the exposed material was throughly exposed to methyl trimethoxysilane gas to make at the exposed area a silicon dioxide coating and finally the thus treated material was subjected to dry etching by using an oxygen plasma (oxygen pressure 0.5 torr; plasma output 140 w) for 15 minutes to obtain a fine resist pattern.

EXAMPLE 3

15 parts of the o-nitrobenzyl tosylate bearing resinous composition (C) obtained in the Synthetic Example 3 were dissolved in 85 parts of methyl ethyl ketone and the solution was filtered through a millipore filter (0.2 $\mu$m) to obtain a photosensitive liquid. Thus obtained liquid was then applied by means of a spinner onto a base plate and then dried in a hot oven (100° C.) for 10 minutes to obtain a photosensitive coating comprised of an acid generatable compound having a film thickness of 1.1 $\mu$m.

The thus formed coating was exposed through a pattern mask to a low pressure mercury lamp having a light intensity of about 10 mw/cm$^2$ at 254 nm for 50 seconds. Thereafter, the mask was removed and the exposed material was thoroughly exposed to methyl trimethoxysilane gas to make at the exposed area a silicon dioxide coating and finally the thus treated material was subjected to dry etching by using an oxygen plasma (oxygen pressure 0.5 torr; plasma output 140 w) for 15 minutes to obtain a fine resist pattern.

EXAMPLE 4

50 parts of the onium salt containing resinous composition (D) obtained in the Synthetic Example 4 were dissolved in 140 parts of methyl ethyl ketone and the solution was filtered through a millipore filter (0.2 $\mu$m) to obtain a photosensitive liquid. Thus obtained liquid was then applied by means of a spinner onto a base plate and then dried in a hot oven (100° C.) for 10 minutes to obtain a photosensitive coating comprised of an acid generatable compound having a film thickness of 1.0 $\mu$m.

The thus obtained coating was exposed through a pattern mask to a low pressure mercury lamp having a light intensity of about 10 mw/cm$^2$ at 254 nm for 50 seconds. Thereafter, the mask was removed and the exposed material was thoroughly exposed to methyl trimethoxysilane gas to make at the exposed area a silicon dioxide coating and finally the thus treated material was subjected to dry etching by using an oxygen plasma (oxygen pressure 0.5 torr; plasma output 140 w) for 15 minutes to obtain a fine resist pattern.

As minutely stated, a resist coating which is excellent in dry etching resistance can be obtained by using a simple operational step and an excellent fine resist pattern can be obtained by the present method.

What is claimed is:

1. A method for forming a resist pattern comprising the steps of:
   (a) providing a photosensitive layer on a base plate with a resinous composition comprising a compound which is able to generate an acid when irradiated with actinic rays;
   (b) exposing said layer through a pattern mask to actinic ray;
   (c) applying an alkoxysilane gas onto the surface of said layer, thereby forming silicon dioxide on the exposed area; and
   (d) subjecting the resultant layer to dry etching.

2. A method according to claim 1, wherein the resinous composition consists essentially of the compound which is able to generate an acid when irradiated with actinic rays and binder resin selected from the group consisting of acrylic resin, epoxy resin, polybutadiene resin and polyester resin.

3. A method according to claim 1, wherein the dry etching is conducted by treatment with an oxygen plasma.

* * * * *